(12) United States Patent
Yamada (10) Patent No.: US 12,396,198 B2
(45) Date of Patent: Aug. 19, 2025

(54) SEMICONDUCTOR DEVICE

(71) Applicant: Fujitsu Limited, Kawasaki (JP)

(72) Inventor: Atsushi Yamada, Hiratsuka (JP)

(73) Assignee: Fujitsu Limited, Kawasaki (JP)

( * ) Notice: Subject to any disclaimer, the term of this patent is extended or adjusted under 35 U.S.C. 154(b) by 467 days.

(21) Appl. No.: 17/929,398

(22) Filed: Sep. 2, 2022

(65) Prior Publication Data

US 2023/0170409 A1 Jun. 1, 2023

(30) Foreign Application Priority Data

Nov. 30, 2021 (JP) ................. 2021-193857

(51) Int. Cl.
*H10D 30/47* (2025.01)
*H10D 62/85* (2025.01)

(52) U.S. Cl.
CPC ....... *H10D 30/475* (2025.01); *H10D 62/8503* (2025.01)

(58) Field of Classification Search
None
See application file for complete search history.

(56) References Cited

U.S. PATENT DOCUMENTS

| 2006/0011915 A1 | 1/2006 | Saito et al. |
| 2014/0001478 A1 | 1/2014 | Saunier et al. |
| 2017/0125564 A1 | 5/2017 | Kotani et al. |
| 2019/0207022 A1 | 7/2019 | Nagase et al. |
| 2023/0170409 A1* | 6/2023 | Yamada ............... H10D 62/402 257/183 |

FOREIGN PATENT DOCUMENTS

| JP | 2014-011462 A | 1/2014 |
| JP | 2017-034201 A | 2/2017 |
| JP | 2017-085014 A | 5/2017 |
| JP | 2017-147320 A | 8/2017 |
| JP | 2019-121785 A | 7/2019 |

OTHER PUBLICATIONS

Wang, H., et al., "High-Performance LPCVD-SiNx/InAlGaN/GaN MIS-HEMTs With 850-V 0.98-m Ω cm$^2$ for Power Device Applications", Journal Of The Electron Devices Society, vol. 6, pp. 1136-1141 (2018).

Office Action mailed on Apr. 15, 2025, issued with respect to the corresponding Japanese Patent Application No. 2021-193857, with full translation (JPOA).

* cited by examiner

*Primary Examiner* — Jack S Chen
(74) *Attorney, Agent, or Firm* — ArentFox Schiff LLP (57) ABSTRACT

A semiconductor device includes a channel layer, a barrier layer disposed above the channel layer, a protective layer disposed on the barrier layer, and an insulating layer disposed on the protective layer. A composition of the barrier layer is represented by $In_{x1}Al_{x2}Ga_{1-x1-x2}N$, where $0.00 \leq x1 \leq 0.20$, and $0.10 \leq x2 \leq 1.00$, and a composition of the protective layer is represented by $In_{y1}Al_{y2}Ga_{1-y1-y2}N$, where $0.00 \leq y1 \leq 0.20$, and $0.10 \leq y2 \leq 1.00$, $x2 < y2$. The protective layer is an amorphous layer.

16 Claims, 12 Drawing Sheets

SEMICONDUCTOR DEVICE

CROSS-REFERENCE TO RELATED APPLICATIONS

This application is based upon and claims the benefit of priority of the prior Japanese Patent Application No. 2021-193857, filed on Nov. 30, 2021, the entire contents of which are incorporated herein by reference.

FIELD

The embodiments discussed herein are related to semiconductor devices.

BACKGROUND

With regard to semiconductor devices using nitride semiconductors, many reports have been made on field effect transistors (FETs), and particularly high electron mobility transistors (HEMTs). As HEMTs using nitride semiconductors, there is a known HEMT using a GaN layer as a channel layer, and an AlGaN layer or an InAlGaN layer as a barrier layer. The InAlGaN layer is more easily lattice-matched to the GaN layer when compared to the AlGaN layer, even when the InAlGaN layer has a high Al composition, and is preferable from a viewpoint of increasing a density of two-dimensional electron gas (2DEG).

A current gain cutoff frequency $f_T$, that is an index of high-frequency characteristics of the HEMT, can be represented by the following formula (1), where $C_{gs}$ denotes a gate-source capacitance, and $g_m$ denotes a transconductance.

$$f_T = \frac{g_m}{2\pi C_{gs}} \quad (1)$$

In addition, the transconductance $g_m$ can be represented by the following formula (2), where $\varepsilon_s$ denotes a dielectric constant, $W_g$ denotes a gate width, vs denotes a saturated drift velocity, d denotes a thickness of the barrier layer, and $\Delta d$ denotes a thickness of the 2DEG.

$$g_m = \frac{\varepsilon_s W_g v_s}{d + \Delta d} \quad (2)$$

As may be seen from the formula (1), the current gain cutoff frequency $f_T$ can be increased by increasing the transconductance $g_m$, and the transconductance $g_m$ can be increased by decreasing the thickness of the barrier layer. In other words, the high-frequency characteristics can be improved by decreasing the thickness of the barrier layer.

Examples of related art include Japanese Laid-Open Patent Publication No. 2017-34201, Japanese Laid-Open Patent Publication No. 2017-147320, U.S. Patent Application Publication No. 2006/0011915, and H. Wang et al, "High-Performance LPCVD-SiNx/InAlGaN/GaN MIS-HEMTs with 850-V 0.98-mΩ·cm² for Power Device Applications", IEEE Journal of the Electron Devices Society, 6, pp. 1136-1141, 2018, for example.

Although an insulating layer, such as a SiN layer or the like, is formed on the barrier layer by plasma chemical vapor deposition (CVD), the InAlGaN layer is more susceptible to surface damage by the plasma when compared to the AlGaN layer. The presence of a defect caused by the surface damage of the barrier layer may reduce electron mobility of the 2DEG and increase sheet resistance. As described above, making the barrier layer thin is effective for improving the high-frequency characteristics, but the thinner the barrier layer becomes, the shorter the distance between the surface of the barrier layer and the 2DEG becomes. For this reason, when the barrier layer is made thin, the 2DEG is particularly susceptible to the effects of the surface defect of the barrier layer, and the sheet resistance is likely to increase. A proposal has also been made to form the insulating layer by thermal CVD to reduce the surface damage, however, the InAlGaN layer is also susceptible to thermal damage, and the sheet resistance is likely to increase.

SUMMARY

Accordingly, it is an object in one aspect of the embodiments to provide a semiconductor device capable of reducing an increase in sheet resistance even when a barrier layer is made thin.

According to one aspect of the embodiments, a semiconductor device includes a channel layer; a barrier layer disposed above the channel layer; a protective layer disposed on the barrier layer; and an insulating layer disposed on the protective layer, wherein a composition of the barrier layer is represented by $In_{x1}Al_{x2}Ga_{1-x1-x2}N$, where $0.00 \leq x1 \leq 0.20$, and $0.10 \leq x2 \leq 1.00$, a composition of the protective layer is represented by $In_{y1}Al_{y2}Ga_{1-y1-y2}N$, where $0.00 \leq y1 \leq 0.20$, and $0.10 \leq y2 \leq 1.00$, $x2 < y2$, and the protective layer is an amorphous layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

A description will now be given of a semiconductor device according to embodiments and modifications of the present invention, with reference to the accompanying drawings. In the present specification and the drawings, constituent elements having substantially the same function or configuration are designated by the same reference numerals, and a repeated description thereof may be omitted.

First Embodiment

Figure 1:
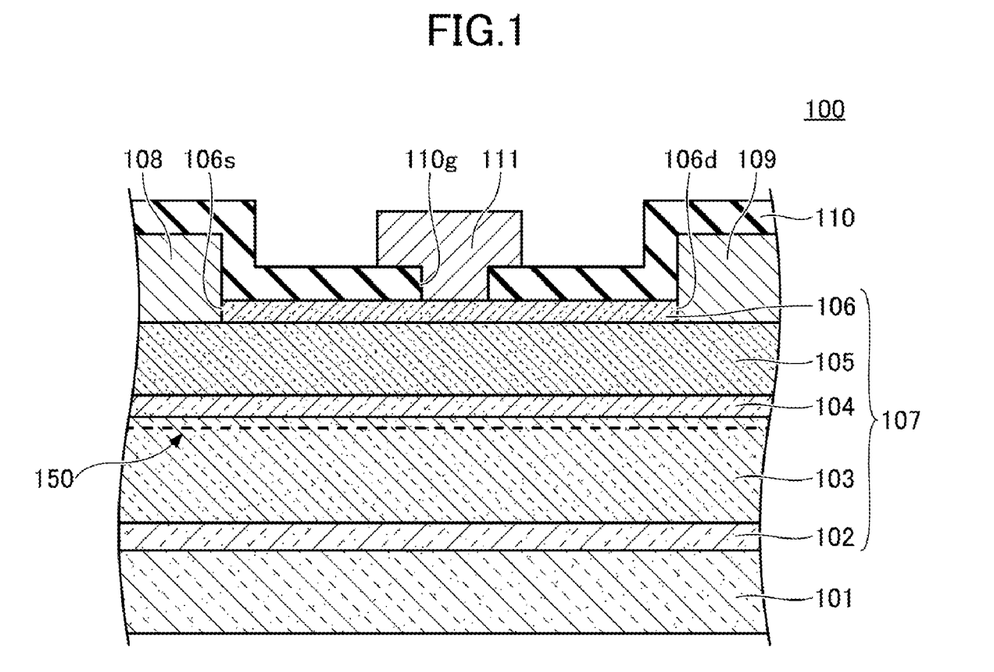
FIG. 1 is a cross sectional view illustrating a semiconductor device according to a first embodiment.

A first embodiment will be described. The first embodiment relates to a semiconductor device including a High Electron Mobility Transistor (HEMT). FIG. 1 is a cross sectional view illustrating the semiconductor device according to the first embodiment.

As illustrated in FIG. 1, in a semiconductor device 100 according to the first embodiment, a nitride semiconductor laminated structure (or nitride semiconductor stacked structure) 107 is formed above a substrate 101. The nitride semiconductor laminated structure 107 includes a nucleation layer 102, a channel layer 103, a spacer layer 104, a barrier layer 105, and a protective layer 106. The nucleation layer 102 is formed on the substrate 101. The channel layer 103 is formed on the nucleation layer 102. The spacer layer 104 is formed on the channel layer 103. The barrier layer 105 is formed on the spacer layer 104. The protective layer 106 is formed on the barrier layer 105.

The substrate 101 is a semi-insulating SiC substrate, for example. The nucleation layer 102 is an AlN layer having a thickness in a range of 5 nm to 150 nm, for example. The channel layer 103 is a GaN layer having a thickness in a range of 1 μm to 5 μm, for example. The spacer layer 104 is an $Al_zGa_{1-z}N$ layer ($0.40<=z<=1.00$) having a thickness in a range of 0.5 nm to 3 nm, for example. That is, the spacer layer 104 is an AlGaN layer having a thickness greater than or equal to 0.5 nm and less than or equal to 3 nm, and an Al composition z greater than or equal to 0.40 and less than or equal to 1.00, for example. The barrier layer 105 is an $In_{x1}Al_{x2}Ga_{1-x1-x2}N$ layer ($0.00<=x1<=0.20$, $0.10<=x2<=1.00$) having a thickness in a range of 4 nm to 10 nm, for example. That is, the barrier layer 105 is an InAlGaN layer having a thickness greater than or equal to 4 nm and less than or equal to 10 nm, an In composition x1 greater than or equal to 0.00 and less than or equal to 0.20, and an Al composition x2 greater than or equal to 0.10 and less than or equal to 1.00, for example.

The protective layer 106 is an amorphous $In_{y1}Al_{y2}Ga_{1-y1-y2}N$ layer ($0.00<=y1<=0.20$, $0.10<=y2<=1.00$, $x2<y2$) having a thickness in a range of 2 nm to 6 nm, for example. That is, the protective layer 106 is an amorphous InAlGaN layer having a thickness greater than or equal to 2 nm and less than or equal to 6 nm, an In composition y1 greater than or equal to 0.00 and less than or equal to 0.20, and an Al composition y2 greater than or equal to 0.10 and less than or equal to 1.00, for example. The Al composition y2 of the protective layer 106 is greater than the Al composition x2 of the barrier layer 105.

The channel layer 103, the spacer layer 104, and the barrier layer 105 have an a-axis in a direction parallel to a principal surface of the channel layer 103, and a c-axis in a direction perpendicular to the principal surface of the channel layer 103. On the other hand, because the protective layer 106 is an amorphous layer, the protective layer 106 does not have a polarization aligned in a direction parallel to the c-axis of the channel layer 103.

A device isolation region defining a device region is formed in the nitride semiconductor laminated structure 107, and an opening 106s for the source and an opening 106d for the drain are formed in the protective layer 106 inside the device region. In addition, a source electrode 108 is formed in the opening 106s, and a drain electrode 109 is formed in the opening 106d. An insulating layer 110, that covers the source electrode 108 and the drain electrode 109, is formed on the protective layer 106. An opening 110g is formed in the insulating layer 110 at a position between the source electrode 108 and the drain electrode 109 in the plan view. A gate electrode 111, that makes contact with the protective layer 106 via the opening 110g, is formed on the insulating layer 110.

The source electrode 108 and the drain electrode 109 include a Ta film having a thickness in a range of 10 nm to 50 nm, and an Al film formed on the Ta film and having a thickness in a range of 100 nm to 500 nm, for example, and make an ohmic contact with the nitride semiconductor laminated structure 107, respectively. The gate electrode 111 includes a Ni film having a thickness in a range of 10 nm to 50 nm, and an Au film formed on the Ni film and having a thickness in a range of 300 nm to 500 nm, for example. The insulating layer 110 includes a layer of a nitride of Si, Al, Hf, Zr, Ti, Ta, or W, for example, and preferably includes a Si nitride (SiN) layer. The insulating layer 110 has a thickness in a range of 2 nm to 500 nm, and is preferably approximately 100 nm, for example.

In the semiconductor device 100, a 2DEG 150 is present in the channel layer 103 below the gate electrode 111, in a state where no voltage is applied to the gate electrode 111. That is, the semiconductor device 100 operates as a normally-on device.

Next, a method for manufacturing the semiconductor device 100 according to the first embodiment will be described. FIG. 2 through FIG. 9 are cross sectional views illustrating the method for manufacturing the semiconductor device 100 according to the first embodiment.

Figure 2:
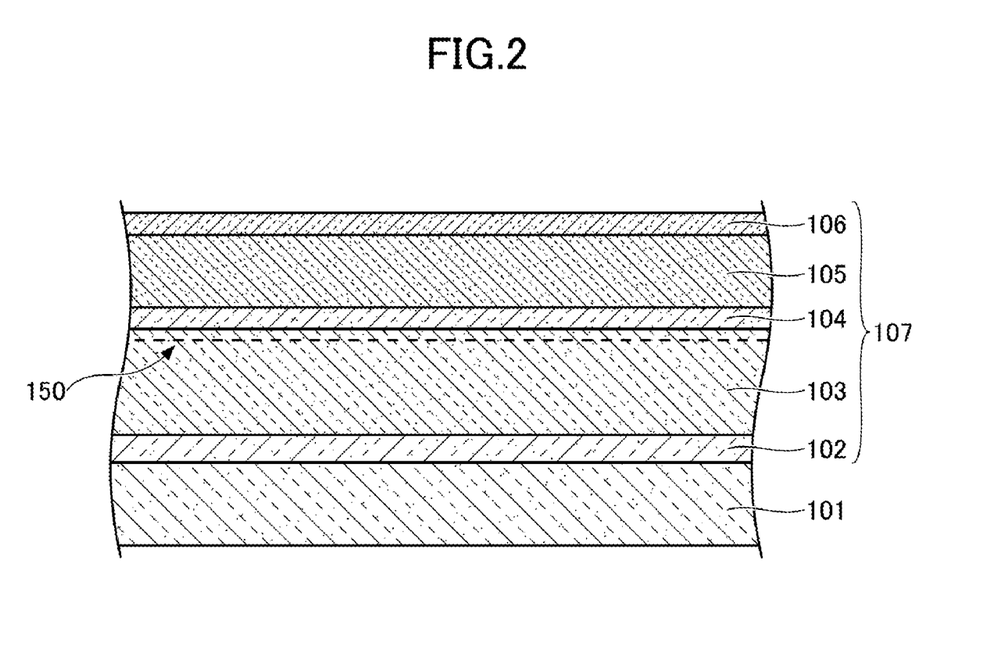
FIG. 2 is a cross sectional view (part 1) illustrating a method for manufacturing the semiconductor device according to the first embodiment.

First, as illustrated in FIG. 2, the nitride semiconductor laminated structure 107 is formed on the substrate 101. When forming the nitride semiconductor laminated structure 107, the nucleation layer 102, the channel layer 103, the spacer layer 104, the barrier layer 105, and the protective layer 106 are formed by a metal organic vapor phase epitaxy (MOVPE), for example. When forming the nitride semiconductor laminated structure 107, a gas mixture of trimethylgallium (TMGa) gas that is a Ga source, and ammonia (NH$_3$) gas that is a N source, is used as a source gas for depositing a GaN layer. A gas mixture of trimethylaluminum (TMAl) gas that is an Al source, and NH$_3$ gas, is used as a source gas for depositing an AlN layer. A gas mixture of TMAl gas, TMGa gas, and NH$_3$ gas, is used as a source gas for depositing an AlGaN layer. A gas mixture of TMAl gas, TMGa gas, trimethylindium (TMIn) gas, and NH$_3$ gas, is used as a source gas for depositing an InAlGaN layer. Whether or not to supply the TMAl gas, the TMGa gas, and the TMIn gas, and a flow rate of such gases, can be set appropriately depending on the composition of the nitride semiconductor layer to be deposited. Hydrogen (H$_2$) gas or nitrogen (N$_2$) gas can be used as a carrier gas. A deposition pressure is in a range of approximately 1 kPa to approximately 100 kPa, and a deposition temperature is in a range of approximately 300° C. to approximately 1200° C., for example. However, the deposition temperature of the protective layer 106 is set lower than the deposition temperatures of the nucleating layer 102, the channel layer 103, the spacer layer 104, and the barrier layer 105, and the protective layer 106 is made an amorphous layer. The deposition temperature of the protective layer 106 is 350° C., for example.

Next, the device isolation region, that defines the device region, is formed in the nitride semiconductor laminated structure 107. When forming the device isolation region, a photoresist pattern that exposes an area where the device isolation region is to be formed, is formed on the nitride semiconductor laminated structure 107, for example, and an ion implantation of Ar or the like is performed using the photoresist pattern as a mask. The photoresist pattern can be used as an etching mask when performing a dry etching using a chlorine-based gas.

Figure 3:
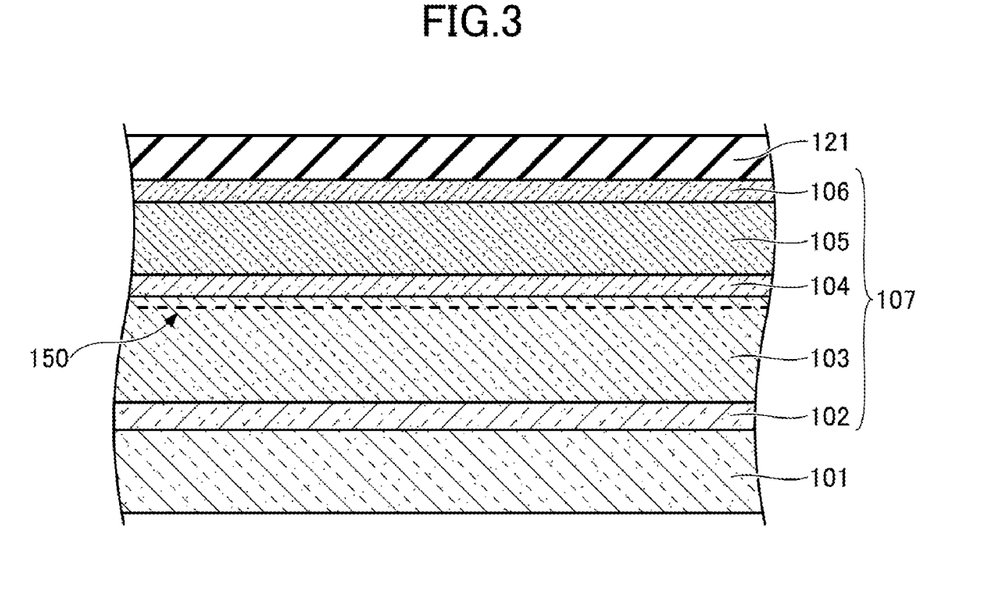
FIG. 3 is a cross sectional view (part 2) illustrating the method for manufacturing the semiconductor device according to the first embodiment.

Thereafter, as illustrated in FIG. 3, a surface protective film 121 is formed on the protective layer 106. The surface protective film 121 includes a layer of an oxide, a nitride, or an oxynitride of Si, Al, Hf, Zr, Ti, Ta, or W, for example, and preferably includes a Si oxide (SiO$_2$) layer. The surface protective film 121 can be formed by plasma CVD, for example. The surface protective film 121 can be formed by atomic layer deposition (ALD) or sputtering.

Figure 4:
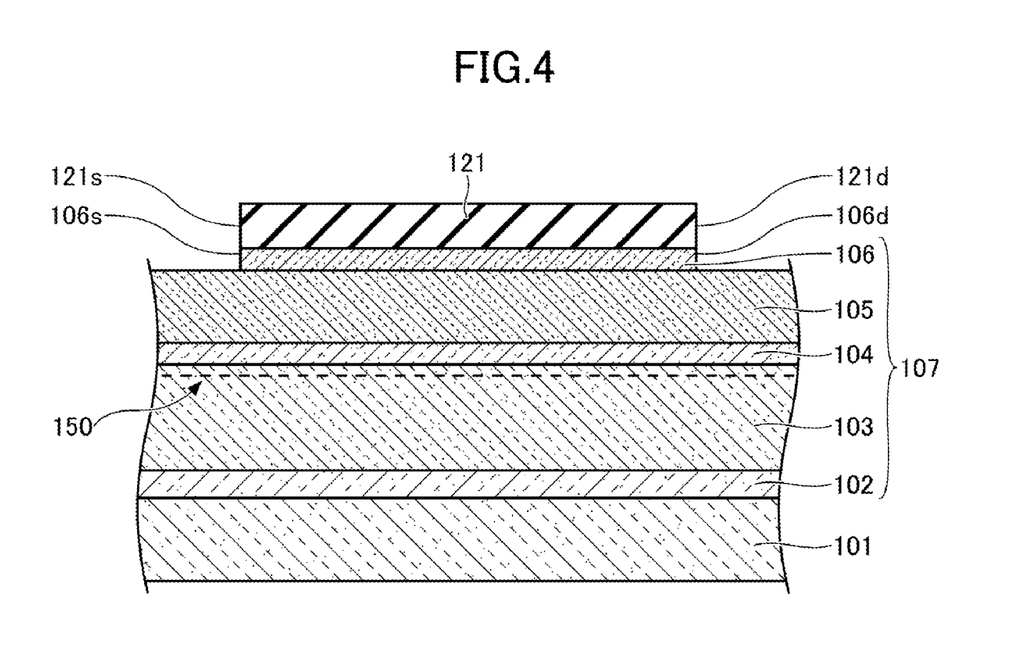
FIG. 4 is a cross sectional view (part 3) illustrating the method for manufacturing the semiconductor device according to the first embodiment.

Next, as illustrated in FIG. 4, openings 121s and 121d are formed in the surface protective film 121, and the openings 106s and 106d are formed in the protective layer 106. When forming the openings 121s, 121d, 106s, and 106d, a photoresist pattern that exposes areas where the openings 106s and 106d are to be formed by photolithography, for example, is formed on the surface protective film 121. Then, the photoresist pattern is used as an etching mask when performing a dry etching using a fluorine-based gas or a chlorine-based gas.

Figure 5:
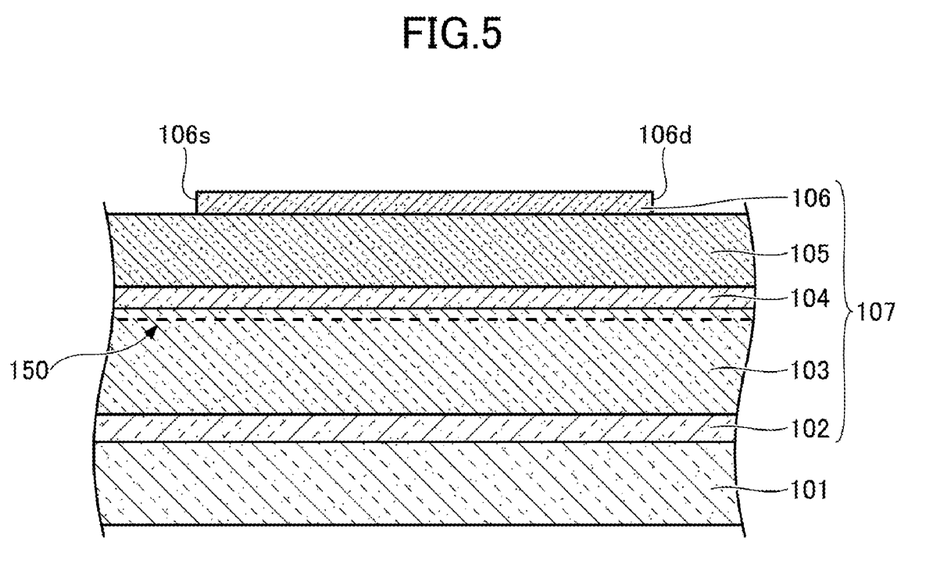
FIG. 5 is a cross sectional view (part 4) illustrating the method for manufacturing the semiconductor device according to the first embodiment.

Next, the surface protective film 121 is removed as illustrated in FIG. 5.

Figure 6:
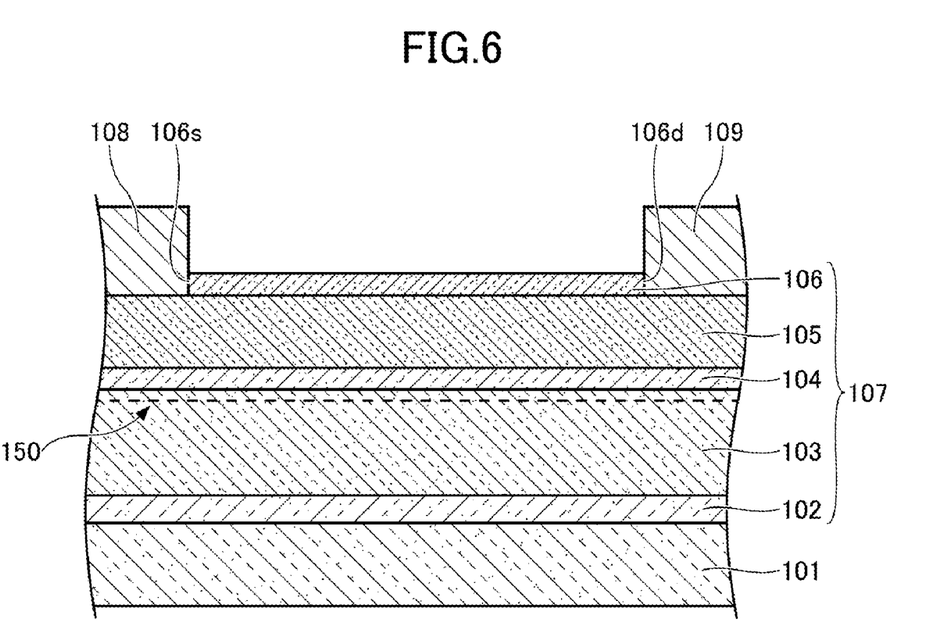
FIG. 6 is a cross sectional view (part 5) illustrating the method for manufacturing the semiconductor device according to the first embodiment.

Thereafter, as illustrated in FIG. 6, the source electrode 108 is formed inside the opening 106s, and the drain electrode 109 is formed inside the opening 106d. The source electrode 108 and the drain electrode 109 can be formed by a lift-off method, for example. That is, the photoresist pattern, that exposes the areas where the source electrode 108 and the drain electrode 109 are to be formed, is formed, the photoresist pattern is used as a deposition mask to form a metal film by deposition, and the photoresist pattern is removed together with the metal film formed thereon. When forming the metal film, a Ta film is formed, and an Al film is formed on the Ta film, for example. Next, a heat treatment is performed at a temperature in a range of 400° C. to 1000° C., for example, in a nitrogen atmosphere, to obtain ohmic characteristics. The heat treatment can be performed at 550° C., for example.

Figure 7:
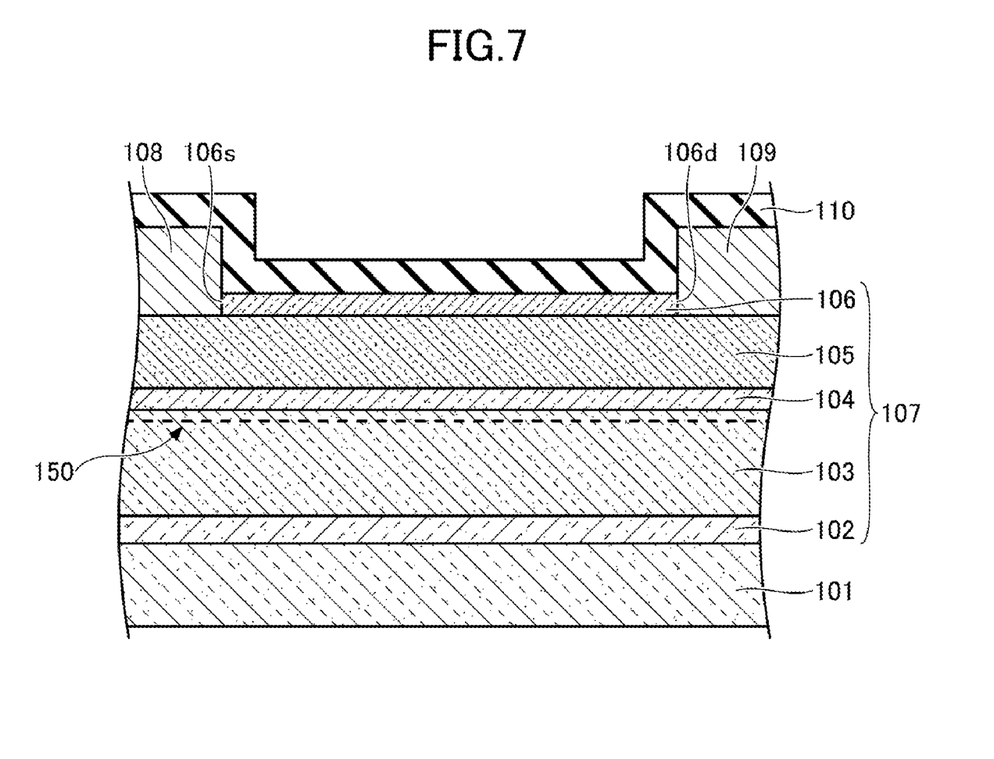
FIG. 7 is a cross sectional view (part 6) illustrating the method for manufacturing the semiconductor device according to the first embodiment.

Then, as illustrated in FIG. 7, the insulating layer 110, that covers the source electrode 108 and the drain electrode 109, is formed on the protective layer 106. The insulating layer 110 can be formed by plasma CVD, for example. The insulating layer 110 can be formed by ALD or sputtering. By forming the insulating layer 110, it is possible to increase a density of the 2DEG 150 near an upper surface of the channel layer 103, below a region between the source electrode 108 and the drain electrode 109.

Figure 8:
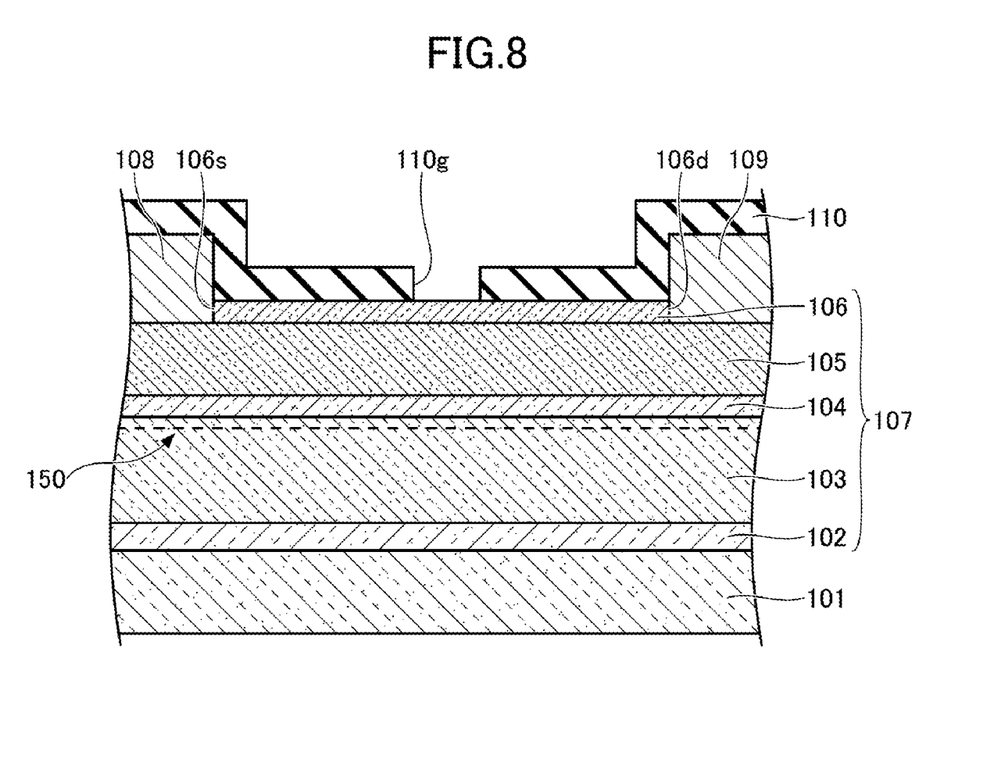
FIG. 8 is a cross sectional view (part 7) illustrating the method for manufacturing the semiconductor device according to the first embodiment.

Next, as illustrated in FIG. 8, the opening 110g is formed in the insulating layer 110. When forming the openings 110g, a photoresist pattern that exposes an area where the opening 110g is to be formed by photolithography, for example, is formed on the insulating layer 110. Then, the photoresist pattern is used as an etching mask when performing a dry etching using a fluorine-based gas or a chlorine-based gas. A wet etching using a fluoric acid, buffered fluoric acid, or the like may be performed in place of the dry etching.

Figure 9:
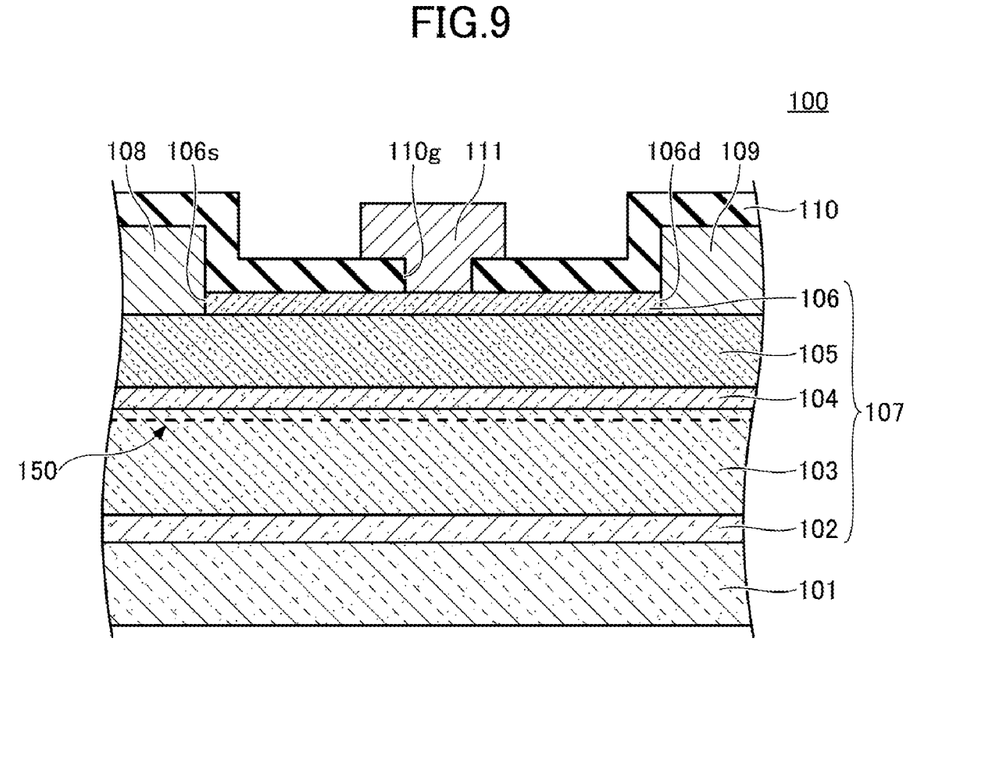
FIG. 9 is a cross sectional view (part 8) illustrating the method for manufacturing the semiconductor device according to the first embodiment.

Thereafter, as illustrated in FIG. 9, the gate electrode 111, that makes contact with the protective layer 106 via the opening 110g, is formed on the insulating layer 110. The gate electrode 111 can be formed by a lift-off method, for example. That is, the photoresist pattern, that exposes the area where the gate electrode 111 is to be formed, is formed, a metal film is formed by deposition using the photoresist pattern as a deposition mask, and the photoresist pattern is removed together with the metal film formed thereon. When forming the metal film, a Ni film is formed, and an Au film is formed on the Ni film, for example.

The semiconductor device 100 according to the first embodiment can be manufactured in the manner described above.

Next, functions and effects of the protective layer 106 will be described, by referring to a reference example. In the reference example, the protective layer 106 is omitted, and the insulating layer 110 is formed on the barrier layer 105 by plasma CVD, so as to make direct contact with the barrier layer 105. In the reference example, it is assumed that an InAlGaN layer having a thickness of 6 nm is used as the barrier layer 105, an amorphous AlN layer having a thickness of 4 nm is used as the protective layer 106, and a SiN layer is used as the insulating layer 110.

Figure 10:
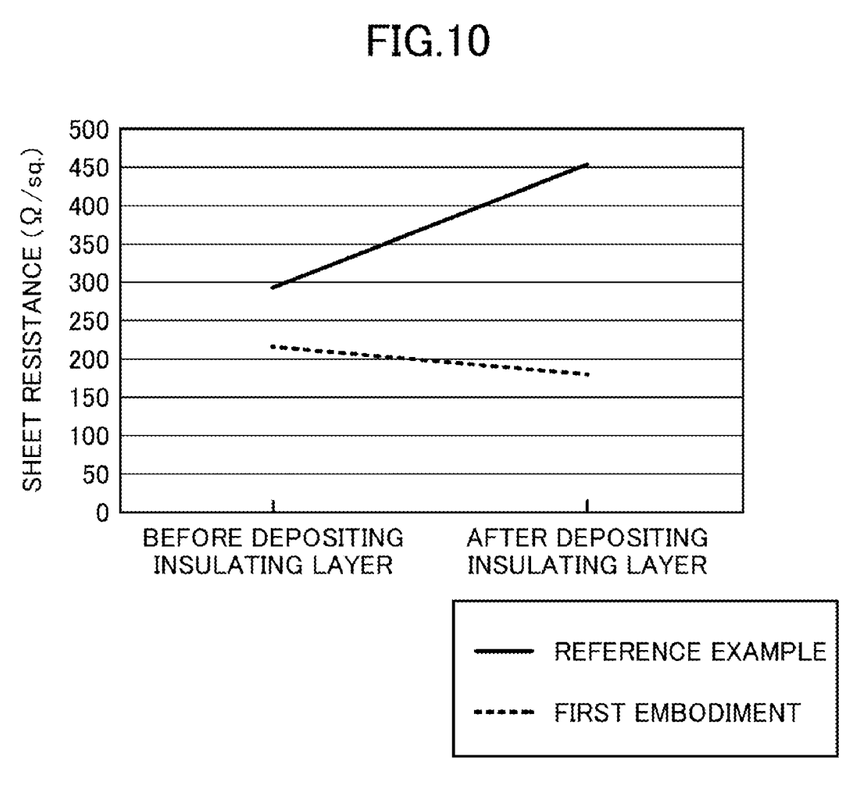
FIG. 10 is a diagram illustrating changes in sheet resistances.

FIG. 10 illustrates changes in sheet resistances of the first embodiment and the reference example. FIG. 10 illustrates the sheet resistance before and after forming the insulating layer 110. As illustrated in FIG. 10, in the first embodiment, the sheet resistance decreases due to forming the insulating layer 110, as indicated by a dashed line. The sheet resistance decreases in the first embodiment because a band structure of the nitride semiconductor laminated structure 107 changes due to forming the insulating layer 110, thereby increasing the density of the 2DEG 150. On the other hand, in the reference example, the sheet resistance increases due to forming the insulating layer 110, as indicated by a solid line. The sheet resistance increases in the reference example because the band structure of the nitride semiconductor laminated structure 107 changes due to forming the insulating layer 110, thereby increasing the density of the 2DEG 150, but generating defects on the surface of the barrier layer 105 caused by plasma when forming the insulating layer 110, and deteriorating electron mobility.

Further, in the reference example, because the insulating layer 110 is directly connected to the barrier layer 105, interdiffusion occurs between Si included in the insulating layer 110 and Ga included in the barrier layer 105. The Si diffused into the barrier layer 105 functions as an n-type impurity, and can function as an electron trap for the 2DEG 150. In contrast, in the first embodiment, because the protective layer 106 is provided between the insulating layer 110 and the barrier layer 105, it is possible to reduce the interdiffusion that occurs in the reference example.

In FIG. 10, before the insulating layer 110 is formed, the sheet resistance of the first embodiment is lower than the sheet resistance of the reference example because a change occurs in the band structure due to forming the protective layer 106. Hence, according to the first embodiment, the density of the 2DEG 150 can be increased, and the sheet resistance can be reduced, also by the change in the band structure associated with forming the protective layer 106.

Accordingly, it is possible to reduce an increase in sheet resistance even when the barrier layer 105 of the semiconductor device 100 is made thin.

Although a composition of the barrier layer 105 can be represented by $In_{x1}Al_{x2}Ga_{1-x1-x2}N$ (0.00<=x1<=0.20, 0.10<=x2<=1.00), it is preferable that the Al composition x2 is greater than or equal to 0.10 and less than or equal to 0.70, and that the barrier layer 105 includes Ga. Alternatively, the Al composition x2 may be greater than or equal to 0.15 and less than or equal to 1.00, or greater than or equal to 0.15 and less than or equal to 0.70.

When the thickness of the barrier layer 105 is greater than 10 nm, the transconductance increases, and high-frequency characteristics may deteriorate. For this reason, the thickness of the barrier layer 105 is preferably less than or equal to 10 nm. That is, a distance between the upper surface of the channel layer 103 and a lower surface of the protective layer 106 is preferably less than or equal to 10 nm. The thickness of the barrier layer 105 is more preferably less than or equal to 9 nm, and even more preferably less than or equal to 8 nm. Further, when the thickness of the barrier layer 105 is less than 4 nm, the 2DEG 150 having a sufficiently high density may not be obtainable. Thus, the thickness of the barrier layer 105 is preferably greater than or equal to 4 nm.

A composition of the protective layer 106 is represented by $In_{y1}Al_{y2}Ga_{1-y1-y2}N$ (0.00<=y1<=0.20, 0.10<=y2<=1.00, x2<y2), but the In composition y1 can be 0.00, the Al composition y2 can be 1.00, and the protective layer 106 can be an AlN layer.

The protective layer 106 preferably does not include Si, Ge, Sn, and O. In contrast, the insulating layer 110 preferably includes Si, Ge, Sn, O, or any combination thereof. That is, the insulating layer 110 preferably includes at least one of Si, Ge, Sn, and O.

When the thickness of the protective layer 106 is greater than 6 nm, the transconductance increases, and the high-frequency characteristics may deteriorate. For this reason, the thickness of the protective layer 106 is preferably less than or equal to 6 nm. The thickness of the protective layer 106 is more preferably less than or equal to 5 nm, and even more preferably less than or equal to 4 nm.

A composition of the spacer layer 104 is represented by $Al_zGa_{1-z}N$ (0.40<=z<=1.00), but the Al composition z can be 1.00, and the spacer layer 104 can be an AlN layer.

The spacer layer 104 may be omitted, and the barrier layer 105 may be in direct contact with the channel layer 103. The same applies to embodiments and modifications which will be described later.

Modification of First Embodiment

Figure 11:
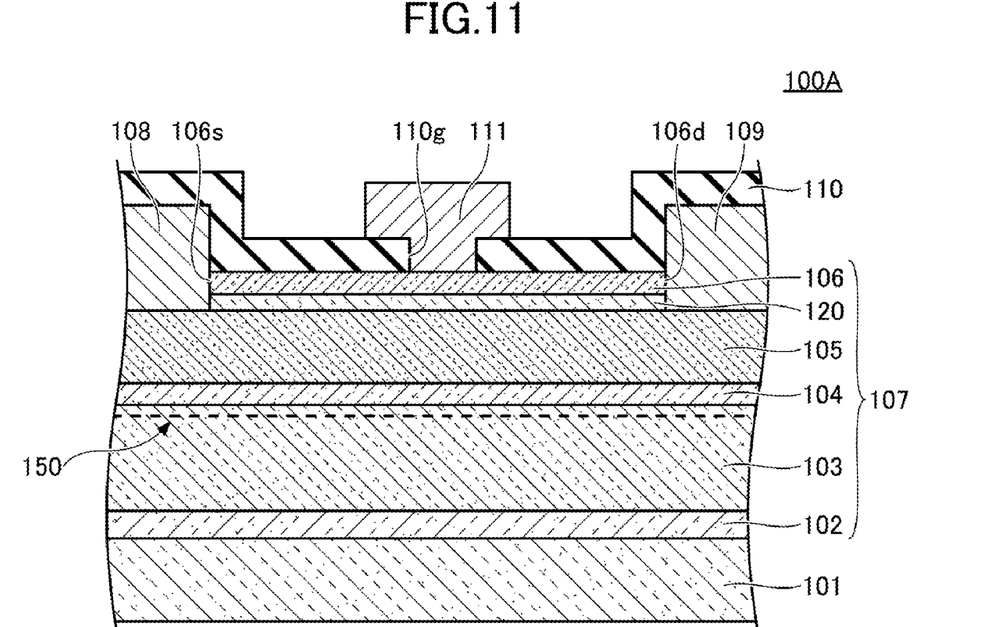
FIG. 11 is a cross sectional view illustrating the semiconductor device according to a modification of the first embodiment.

A modification of the first embodiment will be described. The modification of the first embodiment differs from the first embodiment mainly in the configuration of the nitride semiconductor laminated structure. FIG. 11 is a cross sectional view illustrating the semiconductor device according to the modification of the first embodiment.

As illustrated in FIG. 11, in a semiconductor device 100A according to the modification of the first embodiment, the nitride semiconductor laminated structure 107 includes a cap layer 120 between the barrier layer 105 and the protective layer 106. The cap layer 120 is a GaN layer having a thickness in a range of 8 nm to 12 nm, for example.

Otherwise, the configuration of the modification is similar to that of the first embodiment.

Second Embodiment

Figure 12:
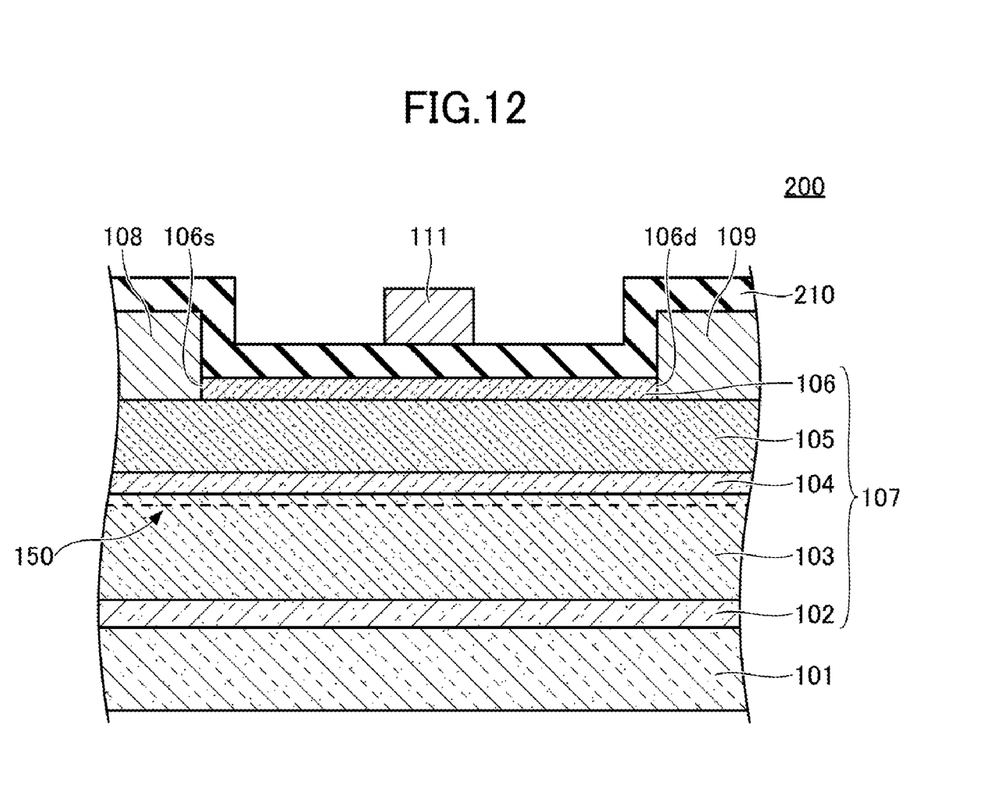
FIG. 12 is a cross sectional view illustrating the semiconductor device according to a second embodiment.

A second embodiment will be described. The second embodiment differs from the first embodiment mainly in the configuration of the insulating layer. FIG. 12 is a cross sectional view illustrating the semiconductor device according to the second embodiment.

As illustrated in FIG. 12, a semiconductor device 200 according to the second embodiment includes an insulating layer 210 in place of the insulating layer 110. Similar to the insulating layer 110, the insulating layer 210 includes a layer of a nitride of Si, Al, Hf, Zr, Ti, Ta, or W, for example, and preferably includes a Si nitride (SiN) layer. The insulating layer 210 has a thickness in a range of 2 nm to 500 nm, and is preferably approximately 100 nm, for example. However, an opening corresponding to the opening 110g is not formed in the insulating layer 210, and the entire lower surface of the gate electrode 111 makes contact with the insulating layer 210. The gate electrode 111 does not make contact with the protective layer 106.

Otherwise, the configuration of the second embodiment is similar to that of the first embodiment.

Figure 13:
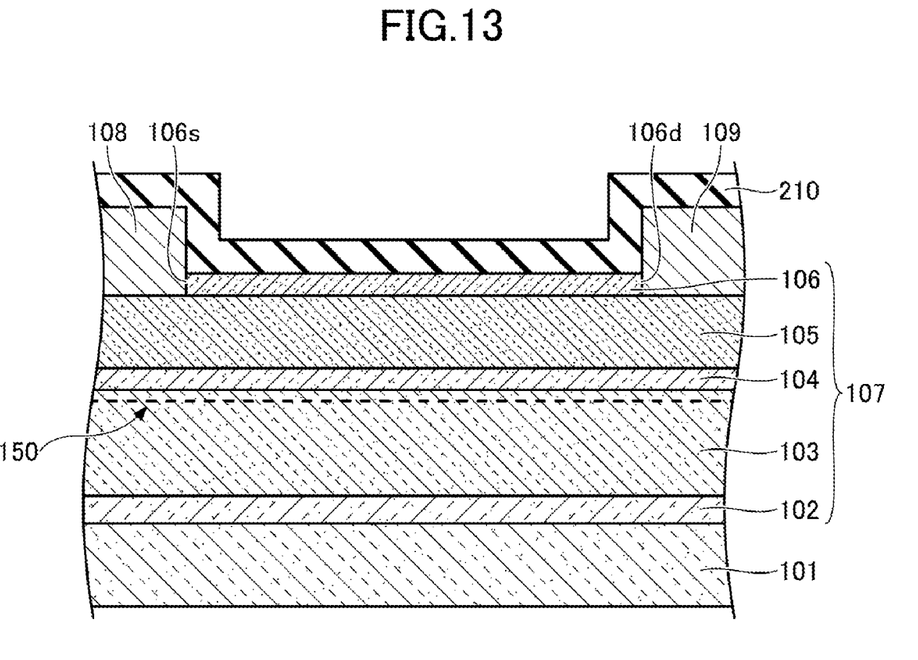
FIG. 13 is a cross sectional view illustrating the method for manufacturing the semiconductor device according to the second embodiment.

Next, a method for manufacturing the semiconductor device 200 according to the second embodiment will be described. FIG. 13 is a cross sectional view illustrating the method for manufacturing the semiconductor device 200 according to the second embodiment.

First, similar to the first embodiment, the processes up to forming the source electrode 108 and the drain electrode 109 are performed, as illustrated in FIG. 6. Then, as illustrated in FIG. 13, the insulating layer 210, that covers the source electrode 108 and the drain electrode 109, is formed on the protective layer 106. The insulating layer 210 can be formed by plasma CVD, for example. The insulating layer 210 can be formed by ALD or sputtering. By forming the insulating layer 210, it is possible to increase the density of the 2DEG 150 near the upper surface of the channel layer 103, below the region between the source electrode 108 and the drain electrode 109.

Thereafter, the gate electrode 111 is formed on the insulating layer 210. The gate electrode 111 can be formed by a lift-off method, for example, similar to the first embodiment.

The semiconductor device 200 according to the second embodiment can be manufactured in the manner described above.

The semiconductor device 200 according to the second embodiment employs a metal-insulator-semiconductor (MIS) type gate structure. Similar to the first embodiment, it is possible to reduce an increase in sheet resistance even when the barrier layer 105 of the semiconductor device 200 is made thin.

Third Embodiment

Figure 14:
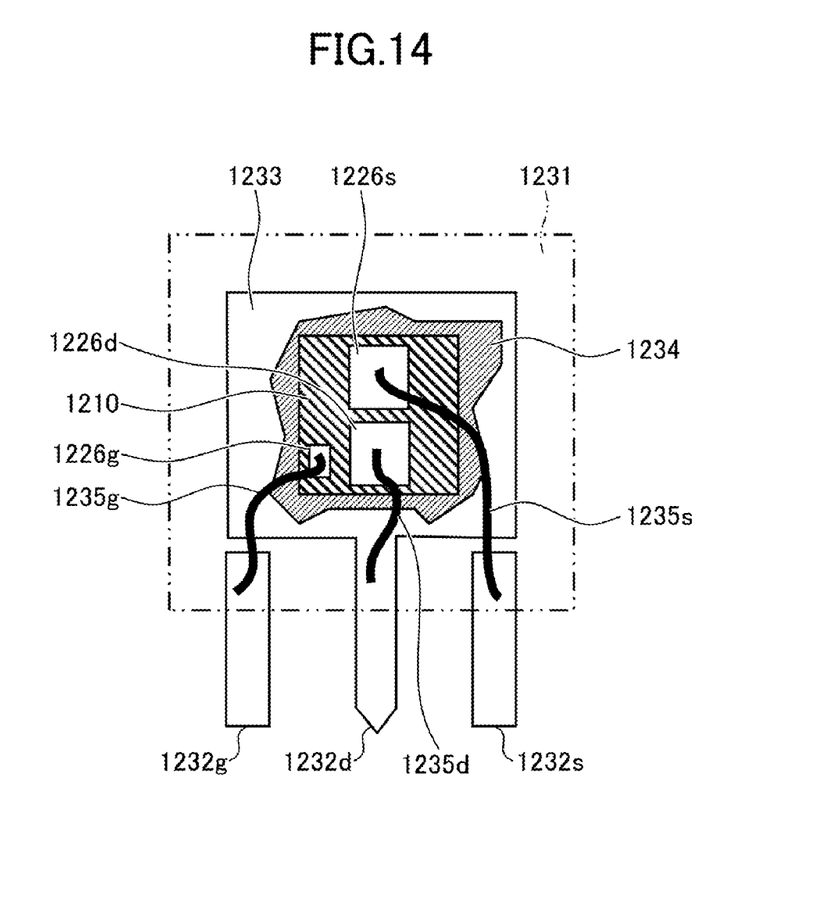
FIG. 14 is a diagram illustrating a discrete package according to a third embodiment.

Next, a third embodiment will be described. The third embodiment relates to a discrete package of HEMT. FIG. 14 is a diagram illustrating the discrete package according to the third embodiment.

As illustrated in FIG. 14, in the third embodiment, a back surface of a semiconductor device 1210 having a configuration similar to that of the first or second embodiment is fixed to a land (die pad) 1233 using a die attach agent 1234, such as a solder or the like. In addition, one end of a wire 1235d, such as an Al wire or the like, is connected to a drain pad 1226d to which the drain electrode 109 is connected, and the other end of the wire 1235d is connected to a drain lead 1232d integral with the land 1233. One end of a wire 1235s, such as an Al wire or the like, is connected to a source pad 1226s to which the source electrode 108 is connected, and the other end of the wire 1235s is connected to a source lead 1232s independent of the land 1233. One end of a wire 1235g, such as an Al wire or the like, is connected to a gate pad 1226g to which the gate electrode 111 is connected, and the other end of the wire 1235g is connected to a gate lead 1232g independent of the land 1233. The, the land 1233, the semiconductor device 1210, or the like are packaged into a package by a mold resin 1231, so that a portion of the gate lead 1232g, a portion of the drain lead 1232d, and a portion of the source lead 1232s protrude from the package.

Such a discrete package can be manufactured in the following manner, for example. First, the semiconductor device 1210 is fixed to the land 1233 of a lead frame using the die attach agent 1234, such as the solder or the like. Then, the gate pad 1226g is connected to the gate lead 1232g of the lead frame, the drain pad 1226d is connected to the drain lead 1232d of the lead frame, and the source pad 1226s is connected to the source lead 1232s of the lead frame, by bonding using the wires 1235g, 1235d, and 1235s, respectively. Thereafter, an encapsulation is performed using the mold resin 1231, by transfer molding. The lead frame is then separated from the mold resin 1231.

Fourth Embodiment

Figure 15:
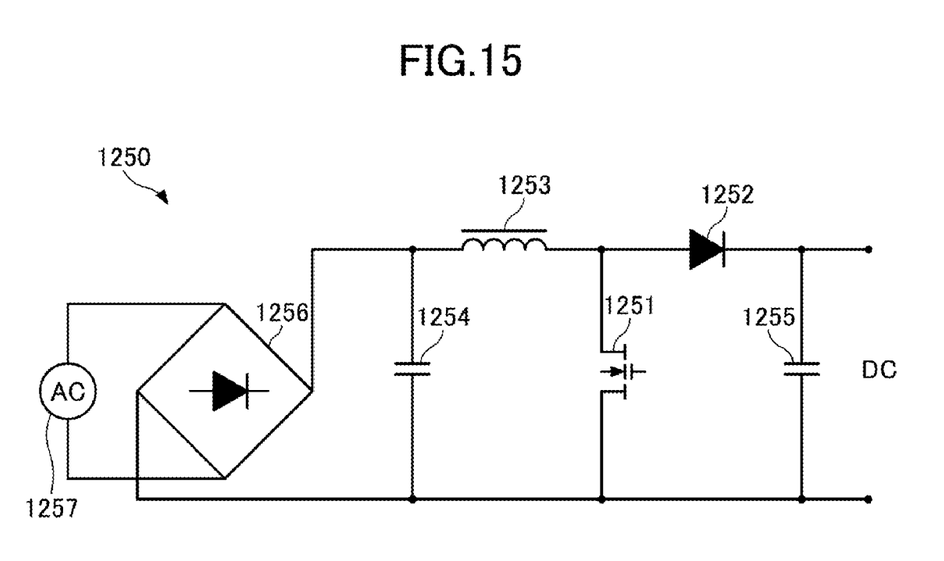
FIG. 15 is a circuit diagram illustrating a PFC circuit according to a fourth embodiment.

Next, a fourth embodiment will be described. The fourth embodiment relates to a power factor correction (PFC) circuit including the HEMT. FIG. 15 is a circuit diagram illustrating the PFC circuit according to the fourth embodiment.

A PFC circuit 1250 includes a switching device (or transistor) 1251, a diode 1252, a choke coil 1253, capacitors 1254 and 1255, a diode bridge 1256, and an AC power supply 1257. A drain electrode of the switching device 1251 is connected to an anode terminal of the diode 1252 and one terminal of the choke coil 1253. A source electrode of the switching device 1251, one terminal of the capacitor 1254, and one terminal of the capacitor 1255 are connected. The other terminal of the capacitor 1254 and the other terminal of the choke coil 1253 are connected. The other terminal of the capacitor 1255 and a cathode terminal of the diode 1252 are connected. In addition, a gate driver is connected to the gate electrode of the switching device 1251. The AC power supply 1257 is connected between the two terminals of the capacitor 1254 via the diode bridge 1256. A DC power supply is connected between the two terminals of the capacitor 1255. In this embodiment, a semiconductor device having a configuration similar to that of the first or second embodiment is used for the switching device 1251.

When manufacturing the PFC circuit 1250, the switching device 1251 is connected to the diode 1252, the choke coil 1253, or the like, using a solder or the like.

Fifth Embodiment

Figure 16:
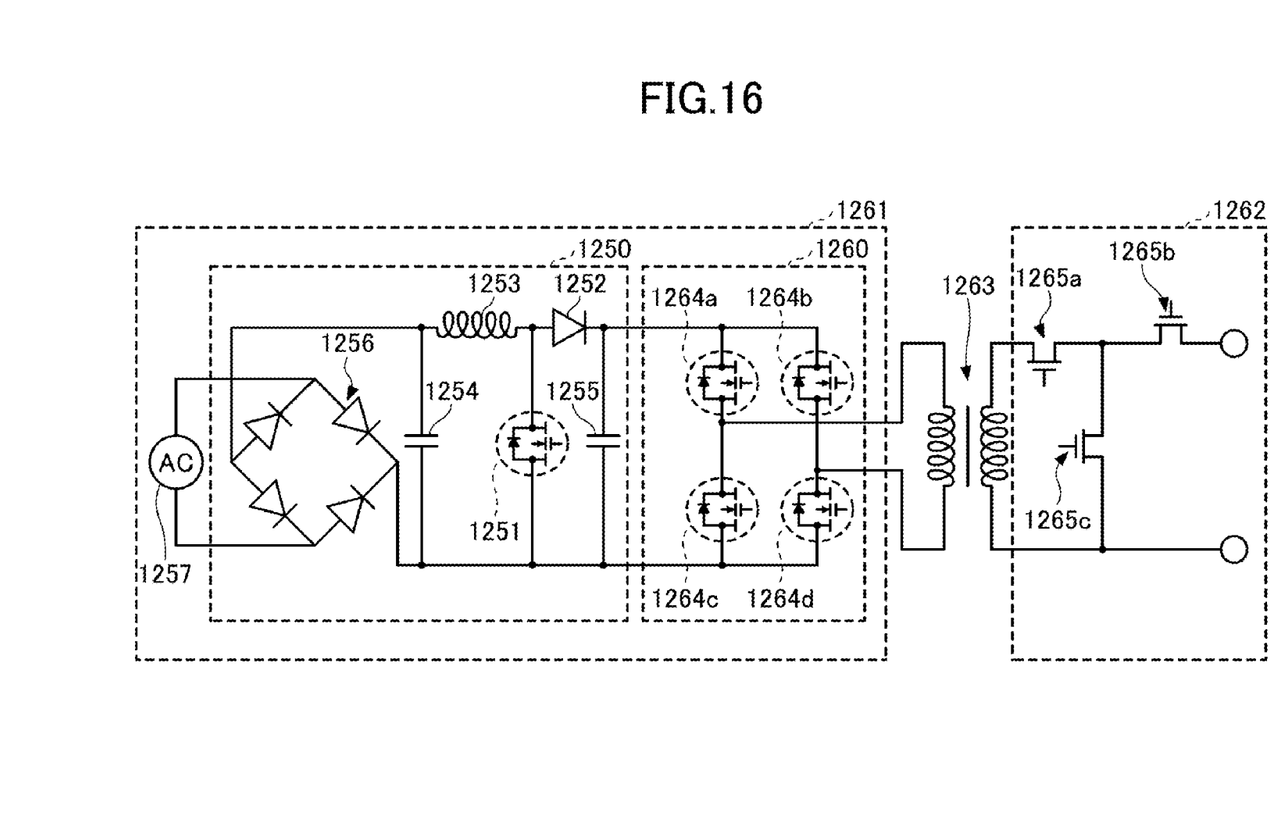
FIG. 16 is a circuit diagram illustrating a power supply device according to a fifth embodiment.

Next, a fifth embodiment will be described. The fifth embodiment relates to a power supply device including the HEMT, suitable for use as a server power supply. FIG. 16 is a circuit diagram illustrating the power supply device according to the fifth embodiment.

The power supply device includes a high voltage primary circuit 1261, a low voltage secondary circuit 1262, and a transformer 1263 disposed between the primary circuit 1261 and the secondary circuit 1262.

The primary circuit 1261 is provided with the PFC circuit 1250 according to the fourth embodiment, and an inverter circuit, such as a full bridge inverter circuit 1260, connected between the two terminals of the capacitor 1255 of the PFC circuit 1250. The full bridge inverter circuit 1260 includes a plurality of switching devices. More particularly, the full bridge inverter circuit 1260 includes four switching devices 1264a, 1264b, 1264c, and 1264d in this example.

The secondary circuit 1262 includes a plurality of switching devices. More particularly, the secondary circuit 1262 includes three switching devices 1265a, 1265b, and 1265c in this example.

In this embodiment, a semiconductor device having a configuration similar to that of the first or second embodiment is used for the switching device 1251 of the PFC circuit 1250, and the switching devices 1264a, 1264b, 1264c, and 1264d of the full bridge inverter circuit 1260, respectively forming the primary circuit 1261. On the other hand, a conventional MIS type field effect transistor (FET) using silicon is used for the switching devices 1265a, 1265b, and 1265c of the secondary circuit 1262.

Sixth Embodiment

Figure 17:
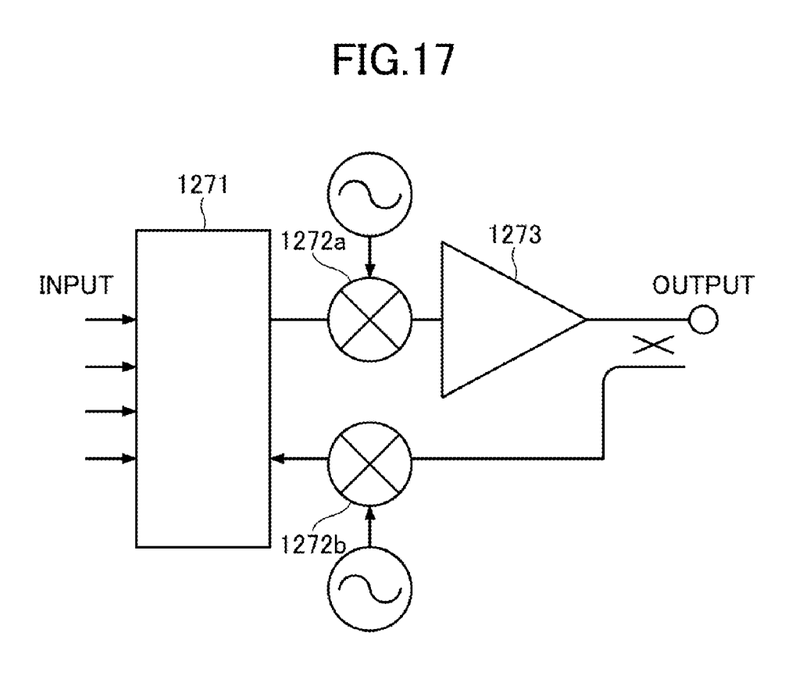
FIG. 17 is a circuit diagram illustrating an amplifier according to a sixth embodiment.

Next, a sixth embodiment will be described. The sixth embodiment relates to an amplifier including the HEMT. FIG. 17 is a circuit diagram illustrating the amplifier according to the sixth embodiment.

The amplifier according to the sixth embodiment includes a digital predistortion circuit 1271, mixers 1272a and 1272b, and a power amplifier 1273.

The digital predistortion circuit 1271 compensates for a nonlinear distortion of an input signal. The mixer 1272a mixes the input signal, compensated of the non-linear distortion, and an AC signal. The power amplifier 1273 includes a semiconductor device having a configuration similar to that of the first or second embodiment, and amplifies the input signal mixed with the AC signal. In this embodiment, an output signal can be mixed with the AC signal by the mixer 1272b, and supplied to the digital predistortion circuit 1271, by switching a switching device, for example. This amplifier can be used as a high-frequency amplifier, a high-power amplifier, or the like. The high-frequency amplifier can be used in transmitting and receiving devices for cellular base stations, radar devices, and microwave generators, for example.

The substrate may be a silicon carbide (SiC) substrate, a sapphire substrate, a silicon substrate, an AlN substrate, a GaN substrate, a diamond substrate, or the like. The substrate may be conductive, semi-insulating, or insulating.

The configurations of the gate electrode, the source electrode, and the drain electrode are not limited to those of the embodiments described above. For example, each electrode may be formed by a single layer. In addition, the method for forming each electrode is not limited to the lift-off method. Further, as long as the ohmic characteristics are obtainable, the heat treatment after forming the source electrode and the drain electrode may be omitted. The heat treatment may be performed after forming the gate electrode.

Moreover, an n-type GaN region may be formed in a portion of the nitride semiconductor laminated structure directly below the source electrode and the drain electrode. This n-type GaN region can be formed by ion implantation, or regrown, for example.

According to the present disclosure, it is possible to provide a semiconductor device capable of reducing an increase in sheet resistance even when a barrier layer is made thin.

Although the embodiments are numbered with, for example, "first," "second," "third," "fourth," "fifth," or "sixth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a channel layer;
a barrier layer disposed above the channel layer;
a protective layer disposed on the barrier layer; and
an insulating layer disposed on the protective layer, wherein
a composition of the barrier layer is represented by $In_{x1}Al_{x2}Ga_{1-x1-x2}N$, where $0.00<=x1<=0.20$, and $0.10<=x2<=1.00$,
a composition of the protective layer is represented by $In_{y1}Al_{y2}Ga_{1-y1-y2}N$, where $0.00<=y1<=0.20$, and $0.10<=y2<=1.00$, $x2<y2$, and
the protective layer is an amorphous layer.

2. The semiconductor device as claimed in claim 1, wherein the protective layer does not include Si, Ge, Sn, and O.

3. The semiconductor device as claimed in claim 1, wherein the protective layer does not have a polarization aligned in a direction parallel to a c-axis of the channel layer.

4. The semiconductor device as claimed in claim 1, wherein the protective layer is an AlN layer.

5. The semiconductor device as claimed in claim 1, wherein the barrier layer includes Ga.

6. The semiconductor device as claimed in claim 1, wherein the insulating layer includes Si, Ge, Sn, O, or any combination thereof.

7. The semiconductor device as claimed in claim 1, wherein a distance between an upper surface of the channel layer and a lower surface of the protective layer is less than or equal to 10 nm.

8. The semiconductor device as claimed in claim 1, wherein a thickness of the protective layer is less than or equal to 6 nm.

9. The semiconductor device as claimed in claim 1, further comprising:
a spacer layer disposed between the channel layer and the barrier layer.

10. The semiconductor device as claimed in claim 1, further comprising:
a cap layer disposed between the barrier layer and the protective layer.

11. The semiconductor device as claimed in claim 1, further comprising:
a gate electrode, a source electrode, and a drain electrode disposed above the barrier layer,
wherein a two-dimensional electron gas is present in the channel layer below the gate electrode, in a state where no voltage is applied to the gate electrode.

12. A power factor correction circuit comprising:
the semiconductor device according to claim 1.

13. An amplifier comprising:
the semiconductor device according to claim 1.

14. The amplifier as claimed in claim 13, further comprising:
a digital predistortion circuit configured to compensate for a nonlinear distortion of an input signal thereto;
a mixer configured to mix an AC signal, and the input signal compensated of the nonlinear distortion by the digital predistortion circuit; and
a power amplifier, including the semiconductor device, and configured to amplify the input signal mixed with the AC signal by the mixer.

15. A power supply device comprising:
the semiconductor device according to claim 1.

16. The power supply device as claimed in claim 15, further comprising:
a high voltage primary circuit including the semiconductor device;
a low voltage secondary circuit; and
a transformer disposed between the high voltage primary circuit and the low voltage secondary circuit.

* * * * *